US005486721A

United States Patent [19]

Herklotz et al.

[11] Patent Number: 5,486,721
[45] Date of Patent: Jan. 23, 1996

[54] LEAD FRAME FOR INTEGRATED CIRCUITS

[75] Inventors: Günter Herklotz, Bruchköbel; Heinz Förderer, Grosskrotzenburg; Thomas Frey, Hanau, all of Germany

[73] Assignee: W.C. Heraeus GmbH, Hanau, Germany

[21] Appl. No.: 221,175

[22] Filed: Mar. 31, 1994

[30] Foreign Application Priority Data

Apr. 10, 1993 [DE] Germany ............... 43 11 872.0

[51] Int. Cl.⁶ .............. H01L 23/48; H01L 23/52; H01L 29/40; H05K 5/02
[52] U.S. Cl. .............. 257/666; 257/748; 257/750; 257/762; 257/766; 257/768; 361/813
[58] Field of Search ............... 257/666, 734, 257/746, 747, 748, 750, 753, 762, 766, 767, 768, 772, 781; 361/723, 813

[56] References Cited

FOREIGN PATENT DOCUMENTS

| | | |
|---|---|---|
| 0132596 | 2/1985 | European Pat. Off. . |
| 0250146 | 12/1987 | European Pat. Off. . |
| 0335608 | 10/1989 | European Pat. Off. . |
| 61-140160 | 6/1986 | Japan . |
| 61-140160 | 6/1986 | Japan . |
| 3102857 | 4/1991 | Japan . |
| 03102857 | 4/1991 | Japan . |
| 03225947 | 10/1991 | Japan . |
| 04114458 | 4/1992 | Japan . |
| 04174546 | 6/1992 | Japan . |
| 04255259 | 10/1992 | Japan . |
| 04335558 | 11/1992 | Japan . |
| 05029517 | 2/1993 | Japan . |
| 63062259 | 3/1993 | Japan . |
| 05098456 | 4/1993 | Japan . |
| 05117898 | 5/1993 | Japan . |

*Primary Examiner*—Sara W. Crane
*Assistant Examiner*—Carl Whitehead, Jr.
*Attorney, Agent, or Firm*—Felfe & Lynch

[57] ABSTRACT

Lead frames completely surface-plated with palladium have a nickel-phosphorus or copper-tin layer between the base element, made for example of copper, and the palladium layer. Such lead frames exhibit good bondability and good solderability without tinning.

20 Claims, No Drawings

LEAD FRAME FOR INTEGRATED CIRCUITS

BACKGROUND OF THE INVENTION

The invention concerns a lead frame for integrated circuits, consisting of a metal base element and a coating of at least two layers, whose outer layer is made of palladium.

Metal lead frames used to produce semiconductor components possess a number of conductor paths connected to one another by webs that are to be removed later, and a support (island) for fastening the semiconductor chip. The semiconductor chip is connected to the inner ends of the conductor paths adjacent to the support by means of very fine electrically conductive wires (called bonding wires); the outer ends of the conductor paths constitute the connection elements for joining the semiconductor component to other electrical or electronic components. The inner connections are produced by bonding, for example with the thermosonic process, and the outer ones generally by soldering.

The lead frames preferably consist of metals and metal alloys with good thermal conductivity, such as copper and copper alloys, and a noble-metal plating that either selectively covers only the support and the regions of the lead frame provided for the connections, or covers the lead frame completely.

The invention is based on a lead frame as disclosed, for example, by EP-A-0 132 596, EP-A-0 250 146, and EP-A-0 335 608.

EP-A-0 132 596 concerns a lead frame for integrated circuits consisting of a base element made of an iron-nickel alloy, whose surface is coated with a thin layer of nickel that bears a very thin layer of gold, silver, palladium, or an alloy of these metals. Because of the material combination of which it is made, the lead frame has good solderability in addition to the other required properties, so that laborious selective plating is not necessary.

EP-A-0 250 146 describes a lead frame coated on all sides with palladium or with a palladium-nickel alloy (20% nickel content). Located between the metal base element made of an iron-nickel alloy with approximately 42% nickel, a copper alloy, stainless steel, or steel sheathed in copper— and the palladium or palladium-nickel layer is an intermediate layer of nickel. The nickel layer improves adhesion between the base element and the palladium or palladium-nickel layer.

EP-A-0 335 608 discloses a lead frame whose base element can be made of copper or a copper alloy, and bears a multilayer coating. Located between the outer layer (made of palladium) and the base element is an insulating layer, adjacent to the base element, made for example of palladium or palladium-nickel, and a layer of, for example, nickel. A further nickel layer can be arranged between the base element and the insulating layer.

JP 61-140 160A relates to a lead frame for making semiconductor components (ICs) hermetically encapsulated in plastic and therefore long-lasting, and constitutes an improvement of the lead frames known up to then, which do not permit moisture-proof encapsulation. To achieve the desired aim, the metal base body of the lead frame is provided all around with a coating of nickel alloy containing boron, phosphorus, iron and/or cobalt and a palladium layer partially covering the coating. The partial palladium layer covers the support for holding the chip and the inside ends of the lead tracks for making the internal connections of the chip. The areas that are important for the moisture-proof external hermetical encapsulation and the pads of the lead frame which are intended for making the external connections, remain without a palladium coating; their surface is formed by the nickel alloy.

The invention provides a lead frame that has a metal base element and a palladium layer, and possesses not only good bondability but good solderability both before and especially after storage. Selecting plating of the chip support and the inner and outer ends of the conductor paths is unnecessary.

According to the invention, either a nickel-phosphorus layer or a copper-tin layer is arranged beneath the palladium layer.

The phosphorus content of the nickel-phosphorus layer can be 1–30 wt %, and the tin content of the copper-tin layer can be 5–60 wt %. However a nickel-phosphorus layer with a phosphorus content of 5–10 wt %, and a copper-tin layer with a tin content of 10–30 wt %, are preferred.

Layers of nickel-phosphorus alloys with a phosphorus content of 1–30 wt % can be produced in very good quality by electroplating methods, and result in good solderability of the outer ends of the leads. Any reduction or increase in the phosphorus content results in poorer solderability, especially after aging. Nickel-phosphorus alloys with a phosphorus content of 5–10 wt % result in very good solderability both before and after aging.

Layers of copper-tin alloys with a tin content of 5–60 wt % can be produced in very good quality by electroplating methods and bring about good solderability at the outer ends of the leads. Any reduction or increase of the tin content results in less good solderability, especially after aging. Copper-tin alloys with a tin content of 10–30 wt % result in very good solderability both before and after aging.

The thickness of the nickel-phosphorus layer is 0.01–5 micrometers, preferably 0.2–2 micrometers; that of the copper-tin layer 0.01–5 micrometers, preferably 0.2–2 micrometers; and that of the palladium layer 0.01–0.5 micrometers, preferably approximately 0.1 micrometers.

It has proven especially successful if a nickel layer is arranged between the base element and the nickel-phosphorus layer or the copper-tin layer. This nickel layer should be no thicker than 5 micrometers; a nickel layer 1–2 micrometers thick is preferred.

The base element can be made of any metal material suitable for that purpose; however, copper and copper alloys are preferred.

The lead frame according to the invention is characterized by good bondability and—as solderability tests have shown—by good solderability both before and after aging. The good solderability despite aging ensures reliable solder connections even after extended storage of the lead frame and of the semiconductor components produced therewith, without the need for previous tinning of the outer ends of the leads.

It must be considered surprising that the nickel-phosphorus layer and the copper-tin layer improve the solderability of the palladium layer located above them, but do not affect the inherently good bondability of the palladium layer.

As is known and usual in the art, the lead frame is produced by stamping out the metal base element from sheet metal present in the form of a strip 0.1–0.3 millimeters thick, and subsequently applying the layers which form the coating, for example by galvanic or chemical deposition from metallization baths, according to standard industrial practice.

For example, a metal base element is stamped out of a 0.2-millimeter thick strip of CuFe2, suitably pretreated if necessary (degreasing, activation, etc.), and given first a 1.5-micrometer thick nickel-phosphorus layer in a galvanic nickel-phosphorus alloy bath, and then a 0.1-micrometer thick palladium layer in a galvanic palladium bath. The deposited nickel-phosphorus layer consists of an alloy containing 90 wt % nickel and 10 wt % phosphorus.

A lead frame having a copper-tin layer beneath the palladium layer is produced similarly, except that a galvanic copper-tin alloy bath is used instead of the galvanic nickel-phosphorus alloy bath. The deposited copper-tin layer consists of an alloy containing 90 wt % copper and 10 wt % tin, and has a thickness of 2 micrometers.

If a nickel layer is also provided in addition to the nickel-phosphorus or copper-tin layer, it can be deposited, for example, from a galvanic nickel sulfamate bath. A nickel layer 1.5 micrometers thick has proven successful; a thickness of 0.5 micrometers is then sufficient for the nickel-phosphorus or copper-tin layer.

The solderability tests are performed according to DIN 32 506, by determining the wetting characteristics of specimens immersed first in a fluxing agent and then in a soldering bath, before and after aging consisting of heat treatment at 155° C. for 16 hours. The fluxing agent corresponds to the one described in DIN 32 506; a Sn60Pb40 soft solder is used for the soldering bath. Wetting of the specimens by the solder is assessed visually. If the wetting is better than 95%, solderability is judged to be good.

The lead frames according to the invention described in Examples 1 to 4, and—for comparison therewith—the lead frame according to the prior art described in Example 5, were used for the solderability tests, results of which are summarized in the Table.

EXAMPLE 1

CuFe2 base element
1.5 micrometer Ni—P (90:10)
0.1 micrometer Pd

EXAMPLE 2

CuFe2 base element
2.0 micrometer Cu—Sn (90:10)
0.1 micrometer Pd

EXAMPLE 3

CuFe2 base element
1.5 micrometer Ni
0.5 micrometer Ni—P (90:10)
0.1 micrometer Pd

EXAMPLE 4

CuFe2 base element
1.5 micrometer Ni
0.5 micrometer Cu—Sn (90:10)
0.1 micrometer Pd

EXAMPLE 5 (Comparison)

CuFe2 base element
1.5 micrometer Ni
0.1 micrometer Pd

TABLE

| Example | Wetting(%)/Solderability | |
|---|---|---|
| | Before Aging | After aging |
| 1 | 100/good | 100/good |
| 2 | 100/good | 100/good |
| 3 | 100/good | 100/good |
| 4 | 100/good | 100/good |
| 5 (comparison) | 100/good | ≦80/poor |

We claim:

1. Lead frame for an integrated circuit, said lead frame comprising
   a metal base element,
   an outer layer of palladium, and
   an intermediate layer consisting of a nickel-phosphorus alloy between said base element and said outer layer, said intermediate layer having a phosphorus content of 1–30 wt %.

2. Lead frame as in claim 1 wherein said intermediate layer has a phosphorus content of 5–10 wt %.

3. Lead frame as in claim 1 wherein said intermediate layer is 0.01–5 millimeters thick.

4. Lead frame as in claim 3 wherein said intermediate layer is 0.2–2 millimeters thick.

5. Lead frame as in claim 1 further comprising a layer of nickel arranged directly on said base element.

6. Lead frame as in claim 5 wherein said layer of nickel is 1–2 micrometers thick.

7. Lead frame as in claim 1 wherein said palladium layer is 0.01–0.5 micrometers thick.

8. Lead frame as in claim 7 wherein said palladium layer is about 0.1 micrometers thick.

9. Lead frame as in claim 1 wherein said base element is made of one of copper and a copper alloy.

10. Lead frame for an integrated circuit, said lead frame comprising
    a metal base element,
    an outer layer of palladium, and
    an intermediate layer consisting of a copper-tin alloy between said base element and said outer layer, said intermediate layer having a tin content of 5–60 wt %.

11. Lead frame as in claim 10 wherein said intermediate layer has a tin content of 10–30 wt %.

12. Lead frame as in claim 10 wherein said intermediate layer is 0.01–5 micrometers thick.

13. Lead frame as in claim 12 wherein said intermediate layer is 0.2–2 micrometers thick.

14. Lead frame as in claim 10 further comprising a layer of nickel arranged directly on said base element.

15. Lead frame as in claim 14 wherein said layer of nickel is 1–2 micrometers thick.

16. Lead frame as in claim 10 wherein said palladium layer is 0.01–0.5 micrometers thick.

17. Lead frame as in claim 16 wherein said palladium layer is about 0.1 micrometers thick.

18. Lead frame as in claim 10 wherein said base element is made of one of copper and a copper alloy.

19. Lead frame as in claim 10 wherein said intermediate layer completely covers said metal base element, and said outer layer completely covers said intermediate layer.

20. Lead frame as in claim 1 wherein said intermediate layer completely covers said metal base element, and said outer layer completely covers said intermediate layer.

* * * * *